United States Patent [19]

Ernsberger

[11] 4,309,495

[45] * Jan. 5, 1982

[54] METHOD FOR MAKING STAINED GLASS PHOTOMASKS FROM PHOTOGRAPHIC EMULSION

[75] Inventor: Fred M. Ernsberger, Pittsburgh, Pa.

[73] Assignee: PPG Industries, Inc., Pittsburgh, Pa.

[*] Notice: The portion of the term of this patent subsequent to May 22, 1996, has been disclaimed.

[21] Appl. No.: 80,875

[22] Filed: Oct. 1, 1979

Related U.S. Application Data

[63] Continuation-in-part of Ser. No. 930,291, Aug. 2, 1978, abandoned, which is a continuation-in-part of Ser. No. 856,054, Nov. 30, 1977, Pat. No. 4,155,735.

[51] Int. Cl.$^3$ .................................................. G03C 7/00
[52] U.S. Cl. ........................................ 430/5; 430/13; 430/198; 430/203; 430/523
[58] Field of Search .................... 430/5, 523, 13, 198, 430/203; 65/30 E

[56] References Cited

U.S. PATENT DOCUMENTS

| | | | |
|---|---|---|---|
| 2,314,804 | 3/1943 | Willson | 49/92 |
| 2,455,719 | 12/1948 | Weyl et al. | 41/42 |
| 2,468,402 | 4/1949 | Kreidl | 117/1 |
| 2,732,298 | 1/1956 | Stookey | 95/5.5 |
| 2,904,432 | 9/1959 | Ross et al. | 96/34 |
| 2,911,749 | 11/1959 | Stookey | 96/36.2 |
| 2,927,042 | 3/1960 | Hall et al. | 117/38 |
| 3,370,948 | 2/1968 | Rosenbauer | 96/36.2 |
| 3,489,624 | 1/1970 | Lake et al. | 156/15 |
| 3,508,982 | 4/1979 | Shearin | 156/3 |
| 3,510,371 | 5/1970 | Frankson | 156/11 |
| 3,515,587 | 6/1970 | Letter | 117/217 |
| 3,542,612 | 11/1970 | Kashau et al. | 156/13 |
| 3,551,304 | 12/1970 | Letter et al. | 204/38 |
| 3,561,963 | 2/1971 | Kiba | 96/36.2 |
| 3,573,948 | 4/1971 | Tarnopol | 117/5.5 |
| 3,620,795 | 11/1971 | Kiba | 117/17.5 |
| 3,622,295 | 11/1971 | Loukes et al. | 204/180 R |
| 3,653,864 | 4/1972 | Rothermal et al. | 65/30 |
| 3,715,244 | 2/1973 | Szupillo | 148/31.5 |
| 3,720,515 | 3/1973 | Stanley | 96/38.4 |
| 3,732,792 | 5/1973 | Tarnopol et al. | 156/15 |
| 3,754,913 | 8/1973 | Takeuchi et al. | 96/38.3 |
| 3,811,855 | 5/1974 | Carlson et al. | 65/30 |
| 3,836,348 | 9/1974 | Sumimoto et al. | 204/130 |
| 3,857,689 | 12/1974 | Koizumi et al. | 65/35 |
| 3,879,183 | 4/1975 | Carlson | 65/30 |
| 3,880,630 | 4/1975 | Izawa | 65/30 |
| 3,896,016 | 7/1975 | Goodman et al. | 204/180 R |
| 3,902,882 | 9/1975 | Loukes et al. | 65/30 |
| 3,905,791 | 9/1975 | Plumat et al. | 65/30 |
| 3,905,818 | 9/1975 | Margrain | 96/36.2 |
| 3,907,566 | 9/1975 | Inoue et al. | 96/48 R |
| 3,933,609 | 1/1976 | Bakov et al. | 204/180 R |
| 3,960,560 | 6/1976 | Sato | 96/36 |
| 3,991,227 | 11/1976 | Carlson et al. | 427/39 |
| 3,991,228 | 11/1976 | Carlson et al. | 427/39 |
| 4,113,486 | 9/1978 | Sato | 96/36 |
| 4,144,066 | 5/1979 | Ernsberger | 427/42 |
| 4,155,735 | 5/1979 | Ernsberger | 204/130 |

OTHER PUBLICATIONS

Reports, Research Laboratory, Asahi Glass Company, Ltd., 25 1, (1975), pp. 51-52.

Coloured Glasses, W. A. Weyl, Society of Glass Technology, 1951, pp. 409-419.

Research, 11, (1958), pp. 461-465, "Coloured Patterns in Glass", Hall et al.

Lineweaver, Journal of Applied Physics, vol. 34, No. 6, Jun. 1963, pp. 1786-1791.

Oldham, Scientific American, Sep. 1977, pp. 111-128.

*Primary Examiner*—Jack P. Brammer
*Attorney, Agent, or Firm*—Dennis G. Millman

[57] ABSTRACT

Glass photomasks having a stained pattern within the glass for use in photolithographic processes are made by exposing and developing a photographic emulsion on a sheet of glass and migrating silver ions from the emulsion into the surface of the glass under the influence of an electric field and moderately elevated temperatures.

18 Claims, 6 Drawing Figures

METHOD FOR MAKING STAINED GLASS PHOTOMASKS FROM PHOTOGRAPHIC EMULSION

CROSS-REFERENCE TO RELATED APPLICATIONS

This application is a continuation-in-part of U.S. application Ser. No. 930,291 filed on Aug. 2, 1978, now abandoned, which in turn was a continuation-in-part of U.S. application Ser. No. 856,054 filed on Nov. 30, 1977, now U.S. Pat. No. 4,155,735.

BACKGROUND OF THE INVENTION

Photomasks are used in the art of photolithography for printing microelectronic circuits and other precision photofabricated parts, such as television shadow masks. In a photolithographic process a substrate is covered with a layer of photoresist in which a pattern is photographically developed by superimposing over the photoresist a photomask having patterned transparent and opaque areas, and then passing actinic radiation, especially ultraviolet light, through the transparent areas of the photomask. A pattern is then developed in the photoresist as a relief image by means of differential solubilities of the exposed and unexposed portions. The resulting image may be either a negative image or a positive image of the photomask, depending upon whether the photoresist is "negative-working" or "positive-working." Etching or other treatments may then be carried out on the underlying exposed portions of the substrate. A general discussion of the state of the art of photofabrication and the role played by photomasks may be found in *Scientific American*, September 1977, pages 111–128.

Since the preparation of a photomask can be laborious and costly, it is desirable for each photomask to be reused many times in the manufacture of photofabricated devices. Therefore, a photomask should be sufficiently durable to withstand extensive use, handling, and occasional cleaning without damage to the precision pattern it carries. It is also highly desirable to maximize the resolution of the pattern carried by a photomask so as to improve the accuracy of the image it imparts to the photofabricated devices being manufactured, which in turn permits further miniaturization of microcircuits and the like.

Photomasks in the prior art have typically consisted of sheets of glass carrying patterned coatings on their surfaces. Photographic emulsion, iron oxide, and chromium are the films most commonly used. While iron oxide and chromium are considerably more durable than photographic emulsion coatings, all three, by their very nature as coatings, are susceptible to scratching and other damage which shortens the useful life of the photomasks. Also, the etching required to produce a desired pattern in iron oxide or chromium films entails a loss of resolution due to the so-called "etch factor," which means that an etched groove grows wider as it grows deeper. This may be lessened by reducing the film thickness, but with a sacrifice in durability. Moreover, chromium films have the drawbacks of being opaque, which is a disadvantage when aligning the photomask with the substrate being processed, and of being reflective, which causes undesirable light scattering.

Photomasks of improved durability were proposed in U.S. Pat. No. 3,573,948 to M. S. Tarnopol and U.S. Pat. No. 3,732,792 to M. S. Tarnopol et al., wherein instead of a coating on the surface of a glass sheet, the opaque areas of the photomask are produced by a stained patern within the glass. While such stained glass photomasks represent a great improvement in durability, the degree of pattern resolution is less than what is desired for some applications. The limited resolution of the stained masks of the aforementioned patents arises from the necessity in one case to deeply etch the pattern through a stained layer of the glass, and in the other case to etch through a difficult-to-remove tin oxide coating, as well the tendency in all cases for a thermally migrated stain to spread laterally from the stained areas into the adjacent unstained areas during the staining process. A stained glass photomask is also shown in U.S. Pat. No. 3,561,963 to W. M. Kiba where the desired pattern is etched into a copper film on the glass substrate and copper ions are then migrated into the glass by heating. In U.S. Pat. No. 3,933,609 to J. S. Bokov et al. the photomask is made by staining the entire surface of a sheet of glass and then selectively etching away portions of the stained layer.

Attempts to minimize lateral diffusion of the staining ions within the glass are disclosed in U.S. Pat. Nos. 2,927,042 to A. J. C. Hall et al., and 3,620,795 to W. M. Kiba. In the former, a film of a stain-producing metal is deposited onto the glass and patterned portions of the film are removed by photoetching. Ions from the remaining patterned film are then migrated into the glass to produce stained areas by applying an electric field through the glass in the desired direction of ion migration while maintaining the glass at an elevated temperature. In the Kiba patent, a pattern is etched into a metal film which acts to block migration of stain-producing ions into the glass. Migration of stain-producing ions through the apertures in the blocking layer is carried out by heating in an electric field. Since resolution is reduced when the pattern is etched into the film, it would be highly desirable to avoid the etching step required by both Hall and Kiba.

U.S. Pat. Nos. 2,732,298 and 2,911,749, both to S. K. Stookey, disclose the production of a stained image within a glass plate by heating a developed silver-containing photographic emulsion on the glass. The use of relatively high temperatures (400° C. to 650° C.) are said to be necessary there to yield a practical rate of silver migration into the glass. The use of such high ion migrating temperatures results in a loss of resolution since the ions are permitted to migrate freely in all directions within the glass. Also, the process of the patents entails burning off organic materials from the emulsion, a step which would be desirable to avoid since the continuity of glass-silver contact can be disturbed by the burning.

U.S. Pat. No. 3,370,948 to Rosenbauer relates to patterned etching of glass wherein silver ions are migrated into the glass to act as an etch resist. The preferred technique is to develop a silver-containing photographic emulsion on the surface of the glass and then migrate the silver into the glass by means of high temperature alone. The methods of U.S. Pat. No. 2,927,042 (Hall et al.) discussed above are mentioned as being alternative approaches to migrating silver into glass.

In the grandparent application, now U.S. Pat. No. 4,155,735, an improved method for making stained glass photomasks is described, wherein staining ions are electromigrated into a glass substrate through apertures in a developed photoresist layer, thereby eliminating the need for a pattern etching step. Other techniques for making stained glass photomasks without etching are disclosed in copending U.S. patent application Ser. No. 60,422 filed on July 25, 1979, by Fred M. Ernsberger, and in U.S. Pat. No. 4,144,066 (Ernsberger). It would be desirable to improve on these methods by simplifying the process steps and improving precision.

SUMMARY OF THE INVENTION

It has now been found that a high resolution stained glass photomask can be made by developing a silver-containing photographic emulsion on a glass substrate and migrating silver from the developed emulsion into the glass by means of an electric field at moderately elevated temperatures. The method of the present invention eliminates the need for an etching step and avoids the loss of resolution attendant thereto. Also, because the photographic emulsion serves as both the pattern generating medium and the source of stain-producing silver, the number of layer depositing steps is reduced to a minimum, thereby simplifying and speeding the process for making stained glass photomasks. Furthermore, the use of moderately elevated temperatures (100° C. to 350° C.) in combination with an electric field to migrate silver ions into the glass has enabled intensely stained images to be formed within the glass in practical treatment times without burning the emulsion layer. Since burning the organic content of the emulsion can cause curling, blistering, or flaking of the emulsion, the avoidance of burning in the present invention is advantageous in that uniform contact is maintained between the emulsion and the glass, which permits uniform migration of silver into the glass. Moreover, burning the emulsion in accordance with prior art practice would disadvantageously require a separate heating step prior to applying electrodes for electromigrating silver ions into the glass.

The use of an electric field in the present invention not only permits silver migration at lower temperatures, but also improves the resolution of the stained image produced within the glass because the unidirectional driving force created by the electric field induces the silver ions to migrate into the glass substantially normal to the surface of the glass.

Silver migrates into the glass in ionic form and replaces mobile cations, especially alkali metal ions such as sodium which are migrated deeper into the glass. To produce a stain, the migrated silver ions must also be reduced to the elemental state and agglomerated into submicroscopic crystals within the glass. Both reduction and agglomeration are achieved by heating in the presence of a reducing agent. In one embodiment of the invention the reducing agent is tin present near the surface of glass which has contacted molten tin in the float forming process. By using float glass having sufficiently high tin content as the glass substrate, no external reducing agent need be supplied, so that the reducing step may be carried out in air, thereby simplifying the process further. In another embodiment, the reducing agent is a reducing gas atmosphere maintained in a heating chamber. The latter embodiment has the ability to yield densely stained patterns in exceptionally short periods of time.

In summary, the method of the present invention for making a stained glass photomask comprises the following steps. First, a developed photographic plate is provided comprising a flat glass substrate on a first surface of which is carried a pattern of electroconductive, silver-containing areas in a photographic emulsion layer and silver-free areas. (Optionally, the pattern may be produced as part of the process by providing a flat glass substrate with a layer of photographic emulsion containing silver halide on a first surface of the glass substrate, placing a master mask over the photographic emulsion layer, exposing patterned areas of the photographic emulsion to actinic radiation through the master mask, and contacting the exposed photographic emulsion with photographic developing solutions, thereby producing on the first surface of the flat glass substrate a pattern of electroconductive silver-containing emulsion areas and silver-free areas.) Second, a first electrode layer is applied onto the developed photographic emulsion on the first side of the glass substrate, and a second electrode layer is applied onto the glass surface on the opposite side of the glass substrate from said first surface. Third, said first electrode layer is connected to the anode side of a source of electrical potential, said second electrode layer is connected to the cathode side of the source of electrical potential, and simultaneously the glass and the layers carried thereon are heated to a temperature between about 100° C. to 350° C. while applying a direct current electric field between the electrode layers so that electric charge passes through the silver-containing emulsion areas and the thickness of the glass substrate and induces migration of silver ions from the silver-containing emulsion areas into portions of the glass underlying the silver-containing emulsion areas while portions of the glass substrate underlying the silver-free areas remain essentially free from migrated silver ions. Fourth, the glass is maintained at an elevated temperature in the presence of a reducing agent for a sufficient time to reduce and agglomerate the migrated silver ions within the glass, thereby producing a stained pattern within the surface of the glass.

DETAILED DESCRIPTION OF INVENTION

Figure 1:
FIGS. 1 through 6 are cross-sectional views through a glass sheet and various layers applied thereto, schematically illustrating the sequence of steps in one embodiment of a method for making stained glass photomasks in accordance with the present invention.

The substrates upon which the photomasks of the present invention are based are transparent sheets of glass. Composition of the glass is not critical so long as it contains mobile cations capable of being electromigrated at moderate voltages to provide sites into which silver stain-producing ions may be injected. Alkali metal ions such as sodium, potassium, and lithium have relatively high mobility in glass and, thus, glasses having at least minor amounts of alkali metal oxides are particularly useful. For example, conventional soda-lime-silica flat glass compositions typically include about 10 to 13 percent by weight sodium oxide and often a trace of potassium oxide, which represents a more than ample supply of mobile cations for practicing the present invention. Borosilicate glass compositions having much lower alkali metal oxide concentrations have been used for coated photomask substrates and may be used with the present invention, provided that the stain intensity produced is adequate to suit the particular needs of the photomask user. Also suitable are commercially available glass compositions formulated for enhanced ion exchange properties, and which are characterized by a substantial amount of aluminum oxide and/or zirconium oxide.

Photographic emulsions useful in the present invention are those which are capable of being developed to produce a residual layer of emulsion and silver or silver halide which has sufficient electrical conductivity to permit electromigration of silver ions from the film into a glass substrate. The emulsion should also have high resolving power in order to maximize the degree of resolution of the photomask produced. A class of photographic emulsions found to be suitable for use in the present invention are the high contrast orthochromatic emulsions used by the graphic arts, preferred examples of which include "Kodak Ortho Plate PFO" and "Kodak Precision Line Plate LPP." Also feasible for use in the invention are "Kodak Projector Slide Plates" and "Kodak Electron Image Plates." All of these products are sold by Eastman Kodak Company, Rochester, N.Y. These products are supplied by the manufacturer in the form of glass plates coated with the emulsion, and the glass plates may conveniently serve as the substrate for making the stained glass photomasks in the present invention.

Exposure and development of the photographic emulsions are carried out in accordance with standard photographic techniques, the precise details of which depend upon the particular product being used and are provided by the manufacturers of photographic emulsions. Basically, photographic emulsions comprise a gelatin carrier in which a silver halide is dispersed. Areas of a layer of a photographic emulsion, when exposed to light, form a latent image, and when subsequently developed by immersion in the appropriate developing solutions the silver halide in the exposed areas is converted to colloidal silver. From this point the process may proceed as the development of a positive image or a negative image depending upon the type of emulsion and developing process being used. To form a negative image, the unexposed areas of the emulsion are dissolved, leaving the colloidal silver on the substrate in the exposed areas. To produce a positive image either an "etch-bleach reversal" process or a "non-etch reversal" process may be used. In either case, the developed colloidal silver is bleached out chemically and the entire plate is re-exposed and subjected to a second development process to convert the silver halide to colloidal silver in the unexposed areas. In the etch-bleach reversal process, the gelatin as well as the silver is removed from the exposed areas, whereas in the non-etch reversal process, a coating of gelatin remains on the entire surface of the substrate. When using either reversal process with the present invention it has been found unnecessary to carry out the second development to produce the colloidal form of silver since it has been found satisfactory to electromigrate silver ions into the glass from the silver halide form in the emulsion layer. The previously mentioned "Kodak Ortho Plate PFO" is adapted for making negative or positive images and the "Kodak Precision Line Plate LPP" is primarily intended for making negatives, although a reversal process may be used.

The present invention employs an electric field to migrate silver ions from the photographic emulsion into the adjacent glass surface, and accordingly the photographic emulsion must be provided with sufficient electroconductivity after developing to enable an electric charge to pass through the emulsion to permit the electromigration of silver ions to take place at a practical rate. Electrical conductivity is influenced by the original silver content of the emulsion and, therefore, the emulsions used for the present invention should be selected to have a relatively high silver content. The nature of the gelatin content of the emulsion and the degree to which the gelatin is dissolved during development also influence the electrical conductivity of the developed emulsion layer. In other words, after the emulsion has been developed, the silver or silver halide particles should be in sufficient proximity to one another so as to provide a path for electric current through the emulsion at reasonable voltages.

A practical voltage for the electromigration step is one which is at least high enough to migrate the desired quantity of silver ions within a reasonable period of time, but not so high as to arc around the edges of the glass substrate between the anode and cathode electrode layers or to cause localized perforation of electric current through the glass substrate which would defeat uniform migration of the ions into the glass. Voltages in the range of about 50 volts to 1000 volts are considered suitable but a voltage of about 2000 volts may be considered excessive.

Another factor affecting the conductivity of the emulsion is the thickness of the emulsion. Conductivity of the emulsion layer decreases with increased layer thickness and, therefore, the emulsion thickness should be minimized so long as sufficient silver per unit area is provided to permit forming a stain of the color density required. However, even the thinnest emulsion layers on commercially available photographic plates and films of the type discussed heretofore contain a more than ample supply of silver per unit area for producing even the darkest stains. For example, a developed emulsion layer about 9 micrometers thick and containing about 36 percent by weight metallic silver has been found to produce satisfactory results, but a layer of that same emulsion only two micrometers thick, for example, would still contain a surplus of silver for producing the staining effect. The practical limiting factor on the emulsion thickness is the ability to produce very thin, pin-hole free coatings of uniform thickness. Some commercially available photographic plates and films include an undercoat and/or overcoat of a non-silver containing layer of gelatin or other material which may decrease the conductivity of the composite and should thus be avoided. However, the "Kodak Electron Image Plate" referred to above, which includes a gelatin overcoat, has been found suitable for imparting a stain to a glass substrate.

The following table illustrates the general magnitude of silver concentration in the coatings of several examples of commercial photographic plates found suitable for use with the present invention. A relatively high concentration of silver per unit area is desirable, but it has been found that the concentration of silver in the gelatin may be an even more important parameter. Conductivity of the gelatin may also be an influential factor.

TABLE I

| | Ag (mg/cm$^2$) | Gelatin (mg/cm$^2$) | Ag/Gelatin |
|---|---|---|---|
| "Kodak Projector Slide Plate" | 0.65 | 1.76 | 0.37 |
| "Kodak Electron Image Plate" | 0.88 | 3.21 | 0.27 |
| "Kodak Ortho | | | |

TABLE I-continued

|  | Ag (mg/cm²) | Gelatin (mg/cm²) | Ag/Gelatin |
|---|---|---|---|
| Plate PFO" | 0.56 | 0.49 | 1.13 |

It has been estimated that at least about 0.1 milligram of silver per square centimeter is required to be migrated into the glass to produce a reasonably dark stain. Thus, all of the above examples theoretically include a great surplus of silver. However, the effective amount of available silver can be affected by the distribution of the silver in the gelatin. Also, silver migrated into the glass is useful for producing the stained image only if it is at a depth which is accessible to the reducing agent employed in the reducing and agglomerating step.

A better understanding of the details of the inventive process may be had from the sequence of process steps illustrated in the drawings wherein one embodiment of the invention is shown. In FIG. 1, a glass substrate 10 is shown with a layer 11 of photographic emulsion on the top surface thereof. Such a coated glass substrate may comprise a commercially prepared photographic plate, or the layer 11 may be applied by the user.

Figure 2:
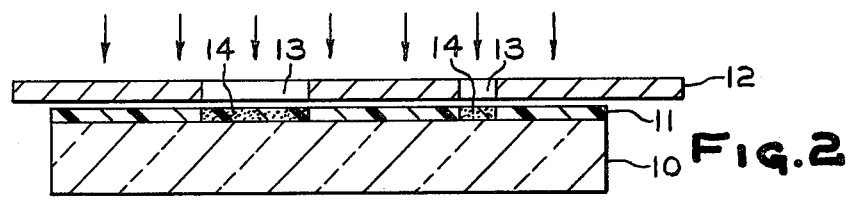

In FIG. 2, a master mask 12 having a pattern of apertures 13 therethrough is superimposed over the layer 11 of photographic emulsion and actinic radiation is passed through the apertures to expose areas 14 in the photographic emulsion. The master mask is shown schematically as an apertured plate, but it should be understood that it is conventional in the art for a master mask to consist of a developed photographic emulsion layer on the surface of a film or glass plate. The master mask preferably contacts the photographic emulsion layer 11, but in other photographic techniques it may be spaced therefrom.

Figure 3:
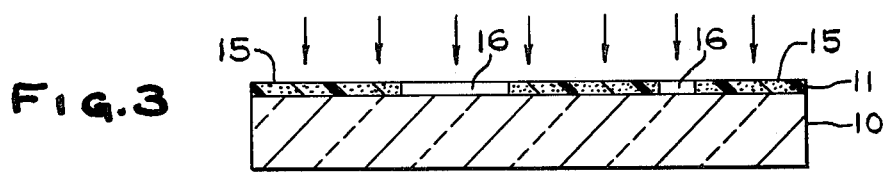
Figure 4:
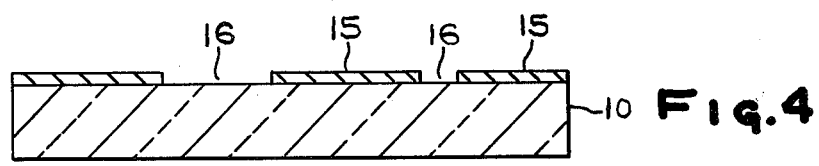

The exposed photographic emulsion may be developed by any of the various development techniques to fix the latent image created in areas 14. In FIG. 3, there is depicted an intermediate step in an etch-bleach reversal development process wherein, by immersing the substrate 10 and the emulsion layer 11 carried thereon into the appropriate developing solutions, the exposed areas 14 have had their silver content bleached out and gelatin dissolved. The remaining portions 15 of the emulsion may have part of their gelatin removed as well in the development process. It has been found that the patterned emulsion layer at this stage of the process is suitable for electromigration even though the silver in the remaining portions 15 of the emulsion are still in the silver halide form. However, if desired, the etch-bleach reversal process may be carried to completion by subjecting the emulsion to a second exposure as shown in FIG. 3 and immersing the substrate and the emulsion into a second development bath, whereby the silver halide is converted to colloidal metallic silver particles as shown in FIG. 4.

Figure 5:
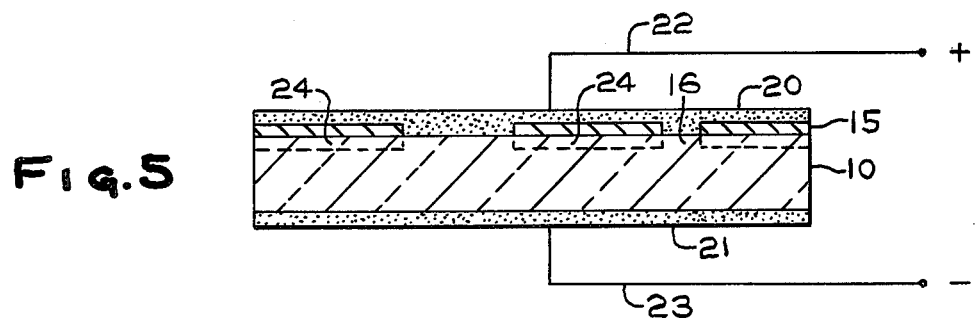

In FIG. 5, electrically conductive electrode layers 20 and 21 have been applied to the opposite surfaces of the glass substrate. Because it is easy to apply and remove, colloidal graphite is the preferred material for the electrode layers 20 and 21. The colloidal graphite layers may be applied to the substrate in slurry form, in which the colloidal graphite is suspended in an aqueous or alcohol vehicle, or the layers may be applied by means of commercially available aerosol sprays of colloidal graphite. Whatever material is used for the electrode layers 20 and 21, it must be applied sufficiently thick to render its resistance insignificant relative to the resistance of the glass (e.g., less than about 10 percent). The electrode layer 20 which overlies the developed photographic emulsion is connected by way of lead 22 to the anode side of a source of electrical potential, and the opposite electrode layer 21 is connected by way of lead 23 to the cathode side of the source of electrical potential.

Imposing a direct current electric field between the electrode layers 20 and 21 as shown in FIG. 5 causes a migration of mobile cations, especially alkali metal ions, out of the surface portion of the glass substrate on the anode side of the substrate. These mobile cations are repelled by the anode and are thus driven deeper into the glass substrate. At the same time, the electric field causes the stain-producing silver ions from the patterned photographic emulsion layer 15 to be injected into the glass in the patterned zones 24 lying directly below the photographic emulsion, where they take the places vacated by the migrated alkali metal ions. It is hypothesized that in the portions of the glass surface underlying the aperture areas 16 protons dissociated from water molecules diffusing through the electrode layer 20 are injected into the glass to take the place of the migrated alkali metal ions. It is believed that the porosity of the colloidal graphite material preferred as the electrode material enables this proton injection to take place.

The rate of ion migration is influenced by temperature and the applied voltage. At room temperature and a potential of only a few volts, the rate of ion migration would be virtually imperceptible. Therefore, elevated temperatures, preferably above 100° C. and a potential of at least about fifty volts are preferred in order to obtain reasonable treatment times. Although photographic emulsions are subject to melting and decomposition at elevated temperatures, it has been found that the use of a moderately elevated temperature in combination with an electric field permits a satisfactory electromigration to be carried out without harming the integrity of the photographic emulsion layer. Thus, the temperature during the electromigration process is maintained above about 100° C. but below the temperature at which the photographic emulsion begins to melt or decompose, which is typically around 5° C. depending upon the particular emulsion being used. As an example, temperatures in the range of about 200° C. to about 250° C. together with a potential of about 300 volts to 700 volts have been found to yield satisfactory results. Temperature and voltage are further interdependent because the conductivity of glass increases with increasing temperature, thereby lessening the voltage requirement. Thus, by selecting an appropriate combination of temperature and voltage, a practical rate of ion migration can be attained without requiring the use of deleteriously high temperatures or excessive voltages.

Figure 6:
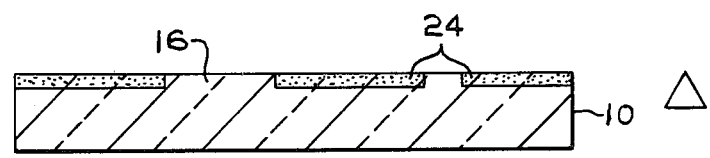

After the silver ions have been electromigrated into the glass to the desired depth, all layers may be removed from the glass substrate leaving nothing but a latent image within the glass substrate in the areas 24. As depicted in FIG. 6, development of coloration in the ion migrated zones 24 requires the application of heat in the presence of a reducing agent to first reduce the silver ions to their elemental state and then to agglomerate the silver ions into a submicroscopic crystalline form. The reducing agent may be present as a constituent of the glass, such as cuprous ions migrated into the glass or the stannous ions inherently present near a surface of glass produced by the float process, or as a reducing atmosphere such as a hydrogen-containing gas (forming gas) in the heating chamber during the reducing and agglomerating heat treatment. Use of the above-mentioned metallic ions as the reducing agent has the advantage of not requiring a controlled atmosphere, and thus can be carried out in air. The amber colored stain thus produced is generally located relatively far below the surface of the glass, thereby enhancing the durability of the photomask. On the other hand, reduction in forming gas produces an olive-green stain marked by relatively high absorptivity. It has also been found that the use of a reducing gas atmosphere permits the use of lower temperatures during the reducing and agglomerating steps, which leads to less spreading of the staining ions into the unstained areas of the pattern, thereby yielding improved resolution of the stained pattern.

The period of the reducing and agglomerating step is a function of temperature. At a temperature as low as 200° C., the reduction and agglomeration may be theoretically able to proceed, but are barely perceptible. Above about 400° C., the process usually proceeds measurably, but the treatment time may still be longer than preferred for a commercial operation. On the other hand, approaching temperatures at which deformation of the glass sheet may occur (e.g., above about 525° C. for the float glass used in the commercial products set forth above) should be avoided. An optimized rate may be achieved at about 475° C. to 525° C., at which temperatures a treatment time on the order of about 15 minutes can yield satisfactory stain coloration. However, when using forming gas as the reductant, it has been found that practical rates can be attained at lower temperatures, e.g., 350° C.–400° C. The lower temperatures are a distinct advantage for the sake of minimizing lateral spread of the staining ions, and thus maximizing resolution of the stained pattern. Treatment times with forming gas on the order of one hour are preferred to produce a fully developed stain at the lower temperatures, at which tin ions as the reducing agent would require many hours to yield a comparable stain density.

The reducing effects of forming gas and an internal ion such as tin have been found to be complementary. Thus both may be used in combination to produce stained patterns having enhanced optical density (ultraviolet absorbance).

The tin-contacted surface of ordinary float glass may commonly be found to contain an average of about 0.5 to 1.3 percent by weight tin (expressed as tin oxide, related to approximately the first five microns), which may be adequate as a reducing agent for purposes of the present invention. Selected float glass having 1.3 to 2.0 percent by weight tin ($SnO_2$) at the surface is preferred, however. Even higher tin contents, which may require special treatment of the glass, produce even better results, since higher tin concentrations permit shallower migration of silver, which reduces the potential for lateral spreading during heat treatment.

Due to the unidirectional influence of the electric field during the migration step, the stained zones 24 have been found to have very distinct boundaries, the sides extending nearly perpendicularly from the top surface of the glass. Also, the depth to which the stained zones extend into the glass appears to be quite uniform and distinct. The depth to which the stain extends into the glass is a function of the charge per unit area passed through the glass during the electromigration step. For a standard soda-lime-silica float glass, this depth can be calculated to be approximately one micron for each 0.1003 coulomb per square centimeter. The quantity of silver migrated into the glass is not strictly proportional to the charge passed per unit area. As electrolysis proceeds, depletion of the supply of silver in immediate contact with the glass surface can lead to the transport of other species, for example $H^+$ ions, into the glass, or $OH^-$ ions out of the glass.

The penetration depth desired for the silver ions will depend upon the particular requirement of a given application, in particular, the intensity of the stain desired. A depth of about one micron, for example, may be sufficient in many cases to render the stained zones sufficiently absorptive of ultraviolet radiation in contrast to the unstained areas. A depth of about 2 microns or more is preferred. The stained areas of the photomask can readily be provided with a transmittance of less than one percent in the violet-ultraviolet range of wavelengths (3,500 to 4,500 Angstroms) most commonly used in photolithographic processes. At the same time, the stained areas remain sufficiently transparent in the visible wavelength spectrum (e.g., about 10 percent or more) to aid an operator in aligning the photomask with a substrate to be printed. The unstained areas of the photomask, of course, retain the radiation transmittance properties of the base glass from which it is made, which might typically be at least an order of magnitude more transparent than the stained areas in the ultraviolet range.

The following two examples are presented to illustrate specific modes of carrying out the process of the invention.

Example 1

A "Kodak Precision Line Plate LPP" was exposed and developed by the etch-bleach reversal process in accordance with the procedure recommended by the manufacturer. The plate was based on a float glass substrate 12 inches by 16 inches by 0.13 inches (30.5 centimeters by 40.6 centimeters by 3.3 millimeters), and the emulsion was coated on the tin contact surface of the glass. Both surfaces of the plate were sprayed with a suspension of colloidal graphite in isopropyl alcohol ("Aerodag G," Acheson Colloids Company, Port Huron, Mich.). The edges of the plate were wiped with a cloth dampened in ethanol to eliminate any overspray of graphite which might cause an electrical short between the upper and lower graphite coatings. The coated plate was supported horizontally in an oven with forced air circulation, and the graphite layer overlying the patterned emulsion was connected to the anode terminal of an adjustable d.c. power supply and the opposite graphite layer was connected to the cathode terminal of the power supply. The temperature of the oven was raised to 210° C. Then a potential of 330 volts was applied which produced a current of 49 milliamperes. This current was maintained by periodic adjustment of the voltage until, after 60 minutes, the voltage reached the 380 volt limit of the power supply. Electromigration was continued with gradually decreasing current for a further 55 minutes at the end of which the current was 23.4 milliamperes. The integrated current dose was calculated to be approximately 72.9 milliampere hours. The plate was removed from the oven, cooled, and the coatings removed with hot water and detergent. At this point, the latent image in the glass was slightly perceptible because of the altered refractive index of the regions into which silver ions had been electromigrated. The plate was then placed on a sheet of heat resistant material and both were conveyed on a roller conveyor into a furnace operating at 900° F. (481° C.). The temperature of the glass in the furnace was monitored, and in 11 minutes the glass temperature reached 900° F. (481° C.), after which the glass was held a further 13 minutes at this temperature, then rapidly conveyed out of the furnace. The glass plate then possessed a patterned stain of amber color corresponding to the areas previously occupied by the developed photographic emulsion. The stained areas of the glass were found to have the following spectral transmission properties:

| Wavelength (Nanometers) | Transmission (Percent) |
| --- | --- |
| 550 | 46 |
| 525 | 32 |
| 500 | 17 |
| 475 | 4.7 |
| 450 | 0.8 |
| 425 | 0.1 |

Example 2

The tin contact surface of a sheet of float glass, four inches by nine inches by 0.190 inches (10.2 centimeters by 22.9 centimeters by 4.8 millimeters), was coated with a layer of "Kodak Ortho Plate PFO." A master mask consisting of a developed photographic film carrying a printed circuit pattern was held in contact with the photographic emulsion on the glass plate by means of vacuum and the emulsion was exposed through the master mask to a diffused source of white light for 80 seconds. The exposed plate was fully developed in Kodak "Kodalith" developer. This developer solution is characterized by hydroquinone as the developing agent and a low concentration of sulphite. The action of the developer was stopped in the conventional manner by a short immersion of the plate in a dilute solution of acetic acid and then fixed conventionally with hyposulphite, washed thoroughly in water, and dried in air. The result was a negative image of the original pattern. Both sides of the plate were coated with colloidal graphite as described in Example 1 and connected to a source of d.c. potential within an oven as described in Example 1. The temperature of the oven was raised to 240° C. and 480 volts was applied, producing a current of 19.7 milliamperes. The voltage was continuously adjusted by an automatic control so as to maintain the current constant. At 40 minutes, the maximum voltage of the supply (700 volts) was reached and thereafter the current declined slowly, reaching 12.1 milliamperes at 65 minutes when electrolysis was discontinued. The plate was cooled immediately, and the coatings removed with hot water and detergent. The plate was then placed in a wire frame and placed in a box furnace at 500° C. in a nearly vertical position for 20 minutes. Upon removal from the furnace, it was covered with an insulating blanket to control cooling and avoid fracture. The glass plate then carried a patterned stain that was a negative reproduction of the original pattern on the film. Optical properties of the stained areas were essentially the same as those in Example 1.

Other modifications and variations as are known to those of skill in the art may be resorted to without departing from the spirit and scope of the invention as set forth by the appended claims.

I claim:

1. A method of making a stained glass photomask comprising:

providing a flat glass substrate with a layer of photographic emulsion containing silver halide on a first surface of the glass substrate;

placing a master mask over the photographic emulsion layer and exposing patterned areas of the photographic emulsion to actinic radiation through the master mask;

contacting the exposed photographic emulsion with photographic developing solutions, thereby producing on the first surface of the flat glass substrate a pattern of electroconductive silver-containing emulsion areas and silver-free areas;

applying a first electrode layer onto the developed photographic emulsion on the first side of the glass substrate and applying a second electrode layer onto the glass surface on the opposite side of the glass substrate from said first surface;

connecting said first electrode layer to the anode side of a source of electrical potential, connecting said second electrode layer to the cathode side of the source of electrical potential, and simultaneously heating the glass and the layers carried thereon to a temperature between about 100° C. to 350° C. while applying a direct current electric field between the electrode layers so that electric charge passes through the silver-containing emulsion areas and the thickness of the glass substrate and induces migration of silver ions from the silver-containing emulsion areas into portions of the glass underlying the silver-containing emulsion areas while portions of the glass substrate underlying the silver-free areas remain essentially free from migrated silver ions;

maintaining the glass at an elevated temperature in the presence of a reducing agent for a sufficient time to reduce and agglomerate the migrated silver ions within the glass, thereby producing a stained pattern within the surface of the glass.

2. A method of making a stained glass photomask comprising:

providing a developed photographic plate comprising a flat glass substrate on a first surface of which is carried a pattern of electroconductive, silver-containing areas in a photographic emulsion layer and silver-free areas;

applying a first electrode layer onto the developed photographic emulsion on the first side of the glass substrate and applying a second electrode layer onto the glass surface on the opposite side of the glass substrate from said first surface;

connecting said first electrode layer to the anode side of a source of electrical potential, connecting said second electrode layer to the cathode side of the source of electrical potential, and simultaneously heating the glass and the layers carried thereon to a temperature between about 100° C. to 350° C. while applying a direct current electric field between the electrode layers so that electric charge passes through the silver-containing emulsion areas and the thickness of the glass substrate and induces migration of silver ions from the silver-containing emulsion areas into portions of the glass underlying the silver-containing emulsion areas while portions of the glass substrate underlying the silver-free areas remain essentially free from migrated silver ions;

maintaining the glass at an elevated temperature in the presence of a reducing agent for a sufficient time to reduce and agglomerate the migrated silver ions within the glass, thereby producing a stained pattern within the surface of the glass.

3. The method of claim 1 or 2 wherein the reducting agent employed to reduce the migrated silver ions comprises stannous ions present within the surface portion of the glass.

4. The method of claim 1 or 2 wherein the first and second electrode layers are comprised of graphite.

5. The method of claim 1 or 2 wherein the electric field is applied at 50 to 1000 volts.

6. The method of claim 1 or 2 wherein the glass is soda-lime-silica glass containing a substantial amount of alkali metal ions.

7. The method of claim 1 or 2 wherein the glass is float glass having a substantial amount of stannous oxide in at least one surface portion thereof.

8. The method of claim 1 or 2 wherein the photographic emulsion layer contains at least about 0.1 milligrams of silver per square centimeter.

9. The method of claim 8 wherein the photographic emulsion is of the high contrast type.

10. The method of claim 3 wherein said reducing and agglomerating step is carried out at 400° C. to 525° C.

11. The method of claim 10 wherein the reducing and agglomerating step is carried out at 475° C. to 525° C.

12. The method of claim 7 wherein the stannous oxide concentration in the first five mirons at the surface of the glass is at least 0.5 percent by weight.

13. The method of claim 7 wherein the stannous oxide concentration in the first five microns at the surface of the glass is at least 1.3 percent by weight.

14. The method of claim 1 or 2 wherein said reducing and agglomerating step is carried out in a reducing atmosphere containing a gaseous reducing agent.

15. The method of claim 14 wherein the reducing atmosphere is forming gas.

16. The method of claim 14 wherein the reducing and agglomerating step is carried out at a temperature of about 350° C. to 400° C.

17. The method of claim 3 wherein the reducing and agglomerating step is carried out in a reducing atmosphere including a gaseous additional reducing agent.

18. The method of claim 14 wherein the reducing and agglomerating step is carried out at a temperature greater than 200° C.

* * * * *